(12) United States Patent
Igarashi

(10) Patent No.: US 9,468,134 B2
(45) Date of Patent: Oct. 11, 2016

(54) SOFT MAGNETIC POWDER, METHOD OF MANUFACTURING THE SAME, NOISE SUPPRESSION SHEET USING THE SAME, AND METHOD OF MANUFACTURING THE SAME

(71) Applicant: Toshiyuki Igarashi, Sendai (JP)

(72) Inventor: Toshiyuki Igarashi, Sendai (JP)

(73) Assignee: NEC TOKIN CORPORATION, Sendai-Shi, Miyagi (JP)

( * ) Notice: Subject to any disclaimer, the term of this patent is extended or adjusted under 35 U.S.C. 154(b) by 195 days.

(21) Appl. No.: 13/772,066

(22) Filed: Feb. 20, 2013

(65) Prior Publication Data

US 2013/0214198 A1 Aug. 22, 2013

(30) Foreign Application Priority Data

Feb. 21, 2012 (JP) ................. 2012-035265

(51) Int. Cl.
| | |
|---|---|
| *H01F 1/147* | (2006.01) |
| *H01F 1/153* | (2006.01) |
| *H01F 1/16* | (2006.01) |
| *H01F 1/20* | (2006.01) |
| *H05K 9/00* | (2006.01) |
| *H01F 1/01* | (2006.01) |
| *B32B 5/16* | (2006.01) |

(52) U.S. Cl.
CPC ............. *H05K 9/0081* (2013.01); *B32B 5/16* (2013.01); *H01F 1/01* (2013.01); *H01F 1/15308* (2013.01); *H01F 1/15366* (2013.01); *H05K 9/0075* (2013.01); *Y10T 428/2982* (2015.01)

(58) Field of Classification Search
CPC .... H01F 1/0027; H01F 1/047; H01F 1/0536; H01F 1/0551; H01F 1/0555; H01F 1/057; H01F 1/0571; H01F 1/0575; H01F 1/0577; H01F 1/0578; H01F 1/058; H01F 1/15308; H01F 1/01; H01F 1/36; H01F 1/15333; H01F 1/20; H01F 1/08; H01F 1/083; H01F 1/14716; H01F 1/14733; H01F 1/15366; H01F 1/16; H01F 1/15375; H01F 1/14775; H01F 1/15325; H01F 1/00; H01F 41/16; H01F 7/0215; H01F 27/365; H05K 9/0073; H05K 9/0075; H05K 9/0081; H05K 9/0098; B32B 5/16; Y10T 428/2982
USPC ...... 252/62.51 R, 62.53–62.59, 62.62–62.64, 252/478, 62, 62.52; 148/121, 304, 305, 148/403; 264/140, 128; 428/402
See application file for complete search history.

(56) References Cited

U.S. PATENT DOCUMENTS

| | | | | | |
|---|---|---|---|---|---|
| 4,923,533 | A | * | 5/1990 | Shigeta | H01F 1/1535 148/304 |
| 4,985,089 | A | * | 1/1991 | Yoshizawa et al. | 148/303 |
| 2005/0236071 | A1 | * | 10/2005 | Koshiba | H01F 1/15308 148/304 |
| 2008/0006352 | A1 | * | 1/2008 | Koshiba | H01F 1/15308 148/561 |
| 2010/0047547 | A1 | * | 2/2010 | Shimizu | B29C 35/02 428/221 |
| 2010/0188186 | A1 | * | 7/2010 | Urata | B22F 3/006 336/233 |
| 2011/0265915 | A1 | * | 11/2011 | Tsuchiya | B82Y 25/00 148/307 |

FOREIGN PATENT DOCUMENTS

| | | |
|---|---|---|
| CN | 1642400 A | 7/2005 |
| JP | 9-027694 A | 1/1997 |
| JP | 09027694 A * | 1/1997 |
| JP | 2004156134 A * | 6/2004 |
| JP | 2005-123531 A | 5/2005 |
| JP | 2007273732 A | 10/2007 |

OTHER PUBLICATIONS

Machine translation of JP 09027694 A, printed Nov. 24, 2014.*
Nielsen et al., "Temperature Dependence of the Magnetostriction and the Induced Anisotropy in Nanocrystalline FeCuNbSiB Alloys and their Fluxgate Properties", Mar. 1994, IEEE Transactions on Magnetics, vol. 30, No. 2, pp. 1042-1044.*
Machine translation of JP2004156134A, printed Oct. 1, 2015.*
Machine translation of J P2004156134A, printed Oct. 1, 2015.*
Japanese Office Action dated Oct. 11, 2012 (and an English translation of the relevant parts thereof) issued in counterpart Japanese Application No. 2012-035265.
Japanese Office Action dated Mar. 13, 2013, issued in counterpart Japanese Application No. 2012-035265.
Chinese Office Action (and English translation thereof) dated Mar. 23, 2016, issued in counterpart Chinese Application No. 201310053747.9.

* cited by examiner

*Primary Examiner* — Matthew E Hoban
*Assistant Examiner* — Lynne Edmondson
(74) *Attorney, Agent, or Firm* — Holtz, Holtz & Volek PC

(57) ABSTRACT

In order to provide a noise suppression sheet whose imaginary part magnetic permeability μ", representing a magnetic loss component, is large at a GHz-band frequency, thus having an excellent noise suppression effect, the noise suppression sheet comprises a flat magnetic powder having a saturation magnetostriction of $12.0 \times 10^{-6}$ or more and $38.0 \times 10^{-6}$ or less and an organic binder.

14 Claims, 2 Drawing Sheets

SOFT MAGNETIC POWDER, METHOD OF MANUFACTURING THE SAME, NOISE SUPPRESSION SHEET USING THE SAME, AND METHOD OF MANUFACTURING THE SAME

This application is based upon and claims the benefit of priority from Japanese Patent Application No. 2012-035265, filed on Feb. 21, 2012, the disclosure of which is incorporated herein in its entirety by reference.

TECHNICAL FIELD

This invention relates to a soft magnetic powder, a method of manufacturing the same, and a noise suppression sheet using the same and, more specifically, relates to a noise suppression sheet that can suppress electromagnetic interference which is caused by leakage of unwanted electromagnetic waves from an electronic device to the outside, caused by interference of those unwanted electromagnetic waves in its internal circuit, or caused by interference of unwanted electromagnetic waves from the outside, to a soft magnetic powder used in the noise suppression sheet, and to a method of manufacturing the soft magnetic powder.

BACKGROUND ART

In recent years, electronic devices, such as mobile telephones and personal computers, have spread significantly and available frequency bands of these electronic devices have been increasing. For example, frequencies in several GHz to several tens of GHz bands have been used for mobile telephones, wireless LANs, and so on.

In addition to the increase in frequency, with a reduction in size and thickness of electronic devices and with an increase in performance thereof, functional degradation due to electromagnetic interference in the electronic devices and radiation noise interference to the outside of the devices have been raised as problems. In view of this, the standard of the International Special Committee on Radio Interference (CISPR) regulates 1 to 6 GHz noise.

As a prior art, there is known an electromagnetic wave absorber formed of a composite magnetic body containing a soft magnetic powder, which uses a crystalline material such as Sendust (registered trademark) or silicon steel, and a resin. For example, JP-A-2005-123531 (hereinafter referred to as Patent Document 1) discloses a flat powder which is for use in an electromagnetic wave absorber.

The conventional electromagnetic wave absorber absorbs an electromagnetic wave by the use of a magnetic loss due to an imaginary part magnetic permeability $\mu''$ of the complex magnetic permeability. Therefore, as the imaginary part magnetic permeability $\mu''$ of the complex magnetic permeability corresponding to a using frequency band shows a greater value, the noise suppression effect of the electromagnetic wave absorber is better.

However, there is a problem that the conventional electromagnetic wave absorber has a small imaginary part magnetic permeability $\mu''$ at a GHz-band frequency and thus cannot obtain a sufficient noise suppression effect.

SUMMARY OF THE INVENTION

Therefore, it is an object of this invention to provide a noise suppression sheet whose imaginary part magnetic permeability $\mu''$, representing a magnetic loss component, is large at a GHz-band frequency, thus having an excellent noise suppression effect.

It is another object of this invention to provide a method of manufacturing the above-mentioned noise suppression sheet.

It is still another object of this invention to provide a soft magnetic powder which is for use in a noise suppression sheet having an excellent noise suppression effect.

Further, it is another object of this invention to provide a method of manufacturing the above-mentioned soft magnetic powder.

In order to achieve the above-mentioned objects, according to one aspect of this invention, there is provided a noise suppression sheet formed of a composite magnetic body which includes a flat magnetic powder having a saturation magnetostriction of $12.0 \times 10^{-6}$ or more and $38.0 \times 10^{-6}$ or less and an organic binder, said flat magnetic powder having an amorphous phase at least one part of the flat magnetic powder, and having no compound crystalline phase precipitated in the flat magnetic powder excluding an $\alpha$-Fe crystalline phase.

According to another aspect of the present invention, there is provided a method of manufacturing a noise suppression sheet, which includes forming, into a sheet shape, a composite magnetic body in which an organic binder is mixed into a flat magnetic powder having a saturation magnetostriction of $12.0 \times 10^{-6}$ or more and $38.0 \times 10^{-6}$ or less, said flat magnetic powder having an amorphous phase at least one part of the flat magnetic powder, and having no compound crystalline phase precipitated in the flat magnetic powder excluding an $\alpha$-Fe crystalline phase.

According to still another aspect of the present invention, there is provided a magnetic powder which has a saturation magnetostriction of $12.0 \times 10^{-6}$ or more and $38.0 \times 10^{-6}$ or less and having a flat shape, said flat magnetic powder having an amorphous phase at least one part of the flat magnetic powder, and having no compound crystalline phase precipitated in the flat magnetic powder excluding an $\alpha$-Fe crystalline phase.

According to yet another aspect to the present invention, there is provided a method of manufacturing a magnetic powder, the magnetic powder being a soft magnetic metal powder made from a soft magtic material and having a fiat shape, which includes: forming an amorphous metal powder from the soft magnetic metal powder by an atomizing method; grinding the amorphous metal powder to form into a flat shape: and heat-treating the flat shape amorphous metal powder to obtain a flat soft magnetic metal powder having a saturation magnetostriction of $12.0 \times 10^{-6}$ or more and $38.0 \times 10^{-6}$ or less.

In the aspect of the present invention, the flat magnetic powder has an amorphous phase at least one part of the flat magnetic powder, and has no compound crystalline phase precipitated in the flat magnetic powder excluding an $\alpha$-Fe crystalline phase.

EFFECT OF THE INVENTION

According to this invention, there can be provided a noise suppression sheet whose imaginary part magnetic permeability $\mu''$, representing a magnetic loss component, is large at a GHz-band frequency, thus having an excellent noise suppression effect.

MODE FOR CARRYING OUT THE INVENTION

Figure 1:
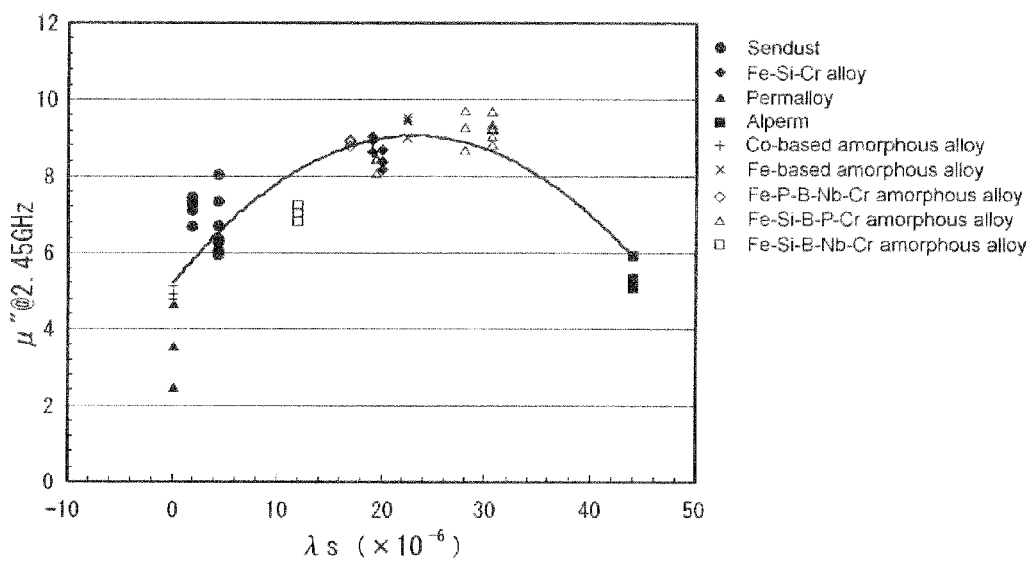
FIG. 1 is a graph showing a relationship between the saturation magnetostriction $\lambda$s and the imaginary part magnetic permeability $\mu''$ per magnetic material.

First, the basic structures of this invention will be described.

(First Basic Structure)

First, a noise suppression sheet according to the first basic structure of this invention comprises a flat magnetic powder having a saturation magnetostriction, $\lambda s$ of $12.0 \times 10^{-6}$ or more and $38.0 \times 10^{-6}$ or less and an organic binder, wherein the noise suppression sheet as a whole has an imaginary part magnetic permeability µ" of 8.3 or more and 15.4 or less at 2.45 GHz.

In order to heighten the imaginary part magnetic permeability µ", a particle size of the magnetic powder may become larger. Therefore in order to obtain the imaginary part magnetic permeability µ" of 8.3 or more and 15.4 or less at 2.45 GHz, the magnetic powder preferably has an average particle size (D50) of 50 µm or more and 127 µm or less.

The manufacture of this noise suppression sheet includes mixing the organic binder into the magnetic powder which is the flat soft magnetic metal powder having the saturation magnetostriction of $12.0 \times 10^{-6}$ or more and $38.0 \times 10^{-6}$ or less and forming them into a sheet shape.

In the soft magnetic metal powder including a magnetic powder according to the present invention, the relationship between a DC magnetic field H0 and an AC magnetic field H is given by the following formula 1. In the case of a magnetic body placed in the AC magnetic field H, magnetization reversal is subjected to a phase delay or inertia due to domain wall motion and magnetization rotation so that magnetization I is given by formula 2. Therefore, the complex magnetic permeability µ of the soft magnetic metal powder is given by formula 3. Herein, j represents an imaginary unit.

$$H = H_0 e^{j\omega t} \quad \text{[Formula 1]}$$

$$I = I_0 e^{j(\omega t - \delta)} \quad \text{[Formula 2]}$$

$$\mu = \frac{I_0 e^{j(\omega t - \delta)}}{H_0 e^{j\omega t}} = \frac{I_0}{H_0} \cdot e^{-j\omega} = \frac{I_0}{H_0} \cos\delta - j \frac{I_0}{H_0} \sin\delta = \mu' - j\mu'' \quad \text{[Formula 3]}$$

The magnitude of a noise suppression effect depends on the imaginary part magnetic permeability µ" and the volume of an absorber. Therefore, in order to achieve a small-volume or thin-shaped noise suppression sheet, µ" is preferably as large as possible.

When a composite magnetic body containing a flat magnetic powder and a resin as a binder is placed in an AC magnetic field, magnetic resonances appear at several ten MHz and several hundred MHz with respect to the frequency and, due to these magnetic resonances, dispersions of µ" appear at low and high frequencies. Of these two µ" dispersions, the µ" dispersion on the high frequency side that takes a maximum value in a frequency range of 1 GHz or more is closely related to a magnetoelastic effect $\sigma \cdot \lambda s$ given by an elastic strain $\sigma$ of the magnetic body and a saturation magnetostriction $\lambda s$ of the magnetic body.

When the saturation magnetostriction $\lambda s$ of the magnetic material is large, the stress is applied not a little from the binder around the magnetic body so that the elastic strain $\sigma$ is slightly imparted to the magnetic body. If this elastic strain $\sigma$ increases, the magnetoelastic effect $\sigma \cdot \lambda s$ also increases so that µ" exceeding µ' (=µ(when $\delta$=0)) in a frequency range lower than the magnetic resonance frequency cannot be obtained, and therefore, µ" becomes small when the saturation magnetostriction $\lambda s$ of the magnetic material is too large.

Consequently, when the saturation magnetostriction $\lambda s$ is in a range of $12.0 \times 10^{-6}$ or more and $38.0 \times 10^{-6}$ or less, the value of the imaginary part magnetic permeability µ" becomes large.

In order to obtain a higher imaginary part magnetic permeability µ" in a 2.45 GHz band, the saturation magnetostriction $\lambda s$ of the soft magnetic metal powder is preferably $12.1 \times 10^{-6}$ or more and $30.6 \times 10^{-6}$ or less.

In addition, in the present invention, use is made of a soft-magnetic metal powder as a magnetic powder shown in the following Table 1. The soft magnetic metal powder may include a soft magnetic alloy powder.

As one example of a method of processing the magnetic powder used in the first basic structure of this invention into a flat shape, there can be cited a method of carrying out grinding in a solvent.

Specifically, it is possible to use a medium stirring type mill such as a ball mill, Attritor (registered trademark), or a pin mill.

The following Table 1 shows examples of soft magnetic alloys constituting magnetic powders according to the present invention together with comparative examples.

TABLE 1

| | Magnetic Material | $\lambda s$ ($\times 10^{-6}$) |
|---|---|---|
| Comparative Example | Sendust | 4.4 |
| | | 1.9 |
| Present Invention | Fe—Si—Cr Alloy | 20.0 |
| | | 19.1 |
| Comparative Example | Permalloy | 0.1 |
| | Alperm | 44.0 |
| | Co-based Amorphous Alloy | 0.1 |
| Present Invention | Fe-based Amorphous Alloy | 22.5 |
| | Fe—P—B—Nb—Cr Amorphous Alloy | 17.0 |
| | Fe—Si—B—P—Cr Amorphous Alloy | 28.1 |
| | | 19.5 |
| | | 30.6 |
| Comparative Example | Fe—Si—B—Nb—Cr Amorphous Alloy | 12.1 |

Description will be made more in detail as regards the soft magnetic alloys shown in Table 1.

First, "Sendust" (Registered Trademark) shown as comparative example in Table 1 is a Fe-based alloy having a composition range of 6 mass % ≤Si≤11 mass %, 4 mass %≤Al≤6 mass %, and the balance Fe. As a specific example, Sendust has a composition represented by 9.5Si-5.5Al—Fe in mass ratio. The alloy has a saturation magnetostriction, $\lambda s$ in a range of $-3.1 \times 10^{-6} \leq \lambda s \leq 5.0 \times 10^{-6}$, In Table 1, two types of Sendust alloy with different flatnesses are shown.

As one example of the soft magnetic metal material, a Fe—Si—Cr alloy has a composition range of 3.5 mass %≤Si≤14.0 mass %, 1.5 mass %≤Cr≤4.5 mass %, and the balance Fe. As a specific example, the Fe—Si—Cr alloy is represented by a formula 6.5Si-3.5Cr—Fe in mass ratio.

As another comparative example, "Permalloy" shown in Table 1 is an alloy represented by 80Ni—Fe in mass ratio.

As still another comparative example, "Alperm" shown in Table 1 is an alloy represented by 14Al—Fe in mass ratio.

As another example according to the present invention, a Fe—P—B—Nb—Cr amorphous alloy has a composition range of 75-80 at % Fe, 4-12 at % P, 8-16 at % B, 1-3 at % Nb, and 1-2 at % Cr. The Fe—P—B—Nb—Cr amorphous alloy has a composition represented by a formula $Fe_{77}P_{10}B_{10}Nb_2Cr_1$ in atomic ratio.

As still another example of the soft magnetic metal material according to the present invention, a Fe—Si—B—P—Cr amorphous alloy has a composition range of 76-80 at % Fe, 4-10 at % Si, 8-10 at % B, 5-10 at % P, and 0.5-2 at % Cr. As a specific example, the Fe—Si—B—P—Cr amorphous alloy has a composition represented by a formula $Fe_{77}Si_6B_9P_7Cr_1$ in atomic ratio.

FIG. 1 is a graph showing the relationship between the saturation magnetostriction λs and the imaginary part magnetic permeability μ" per magnetic material. Specifically, the graph shows the relationships between the saturation magnetostriction λs of magnetic materials shown in Table 1 and the imaginary part magnetic permeability μ" of the complex magnetic permeability at 2.45 GHz of composite magnetic bodies containing those magnetic materials.

As is clear from FIG. 1, it is seen that while the saturation magnetostriction λs of the magnetic powder is about not more than $22.5 \times 10^{-6}$, the imaginary part magnetic permeability μ" increases as the saturation magnetostriction λs increases. However, after the saturation magnetostriction λs increases to exceed about $22.5 \times 10^{-6}$, the imaginary part magnetic permeability μ" gradually decreases and, therefore, it is seen that the value of the imaginary part magnetic permeability μ" increases while the saturation magnetostriction is in the specific range, As a material of the organic binder used in this invention, it is possible to use a thermoplastic resin such as acrylic rubber, chlorinated polyethylene rubber, polybutadiene rubber, polyisopropylene rubber, ethylene propylene rubber, ethylene propylene diene rubber, styrene-butadiene rubber, nitrile rubber, epichlorohydrine rubber, neoprene rubber, butyl rubber, polysulphide, elastomer rubber such as urethane rubber, polyethylene, polypropylene, polystyrene, acrylic, polyvinyl chloride, polycarbonate, nylon, urethane, polybutylene terephthalate-polyethylene terephthalate, or acrylonitrileoutadienestyrene (ABS), a thermosetting resin such as melamine, phenol, epoxy, urethane, polyimide, diallyl phthalate, unsaturated polyester, or furan, or the like. Preferably, the ratio of the organic binder is 25 to 45 vol %

However, the material of the organic binder is not limited to the above-mentioned materials and the most suitable material can be selected according to the use of a noise suppression sheet to be manufactured, a manufacturing apparatus, and so on.

In order to impart flame resistance to the noise suppression sheet formed of the composite magnetic body or to improve its flame resistance, the organic binder may contain nonmagnetic fine particles such as magnesium hydroxide or melamine cyanurate that exhibit an endothermic action at a temperature of 200° C. or more, or nonmagnetic fine particles such as red phosphorus that form a nonflammable film at a temperature of 200° C. or more.

(Second Basic Structure)

Next, the second basic structure of this invention will be described.

First, a noise suppression sheet according to the second basic structure of this invention comprises a soft magnetic metal powder of a flat magnetic powder having a saturation magnetostriction of $12.0 \times 10^{-6}$ or more and $38.0 \times 10^{-6}$ or less and an organic binder, wherein the noise suppression sheet as a whole has an imaginary part magnetic permeability μ" of 8.3 or more and 15.4 or less at 2.45 GHz.

In order to obtain the imaginary part magnetic permeability μ" of 8.3 or more and 15.4 or less at 2.45 GHz, the magnetic powder preferably has an average particle size (D50) of 50 μm or more and 127 μm or less.

In the noise suppression sheet according to the second basic structure, it is preferable that use is made of the soft magnetic metal powder which has a saturation magnetostriction of $12.1 \times 10^{-6}$ or more and $30.6 \times 10^{-6}$ or less and contains a soft magnetic metal material, and it is more preferable that the magnetic powder comprises an Fe-based amorphous alloy powder and has amorphous and crystalline two phases of Fe.

The manufacture of the noise suppression sheet includes mixing an organic binder into a flat soft magnetic metal powder having a saturation magnetostriction of $12.0 \times 10^{-6}$ or more and $38.0 \times 10^{-6}$ or less and forming them into a sheet shape.

Herein, the soft magnetic metal powder preferably has a saturation magnetostriction of $12.1 \times 10^{-6}$ or more and $30.6 \times 10^{-6}$ or less and more preferably contains a soft magnetic metal material.

As the soft magnetic metal powder, use is made of an Fe-based amorphous alloy powder having amorphous and crystalline two phases of Fe.

The manufacture of this soft magnetic metal powder comprises a process of producing an amorphous metal powder by an atomizing method, a grinding process of forming the amorphous metal powder into a flat shape by grinding to thereby obtain a flat metal powder, and a heat treatment process of heat-treating the obtained flat metal powder to thereby obtain a flat metal powder having a saturation magnetostriction of $12.0 \times 10^{-6}$ or more and $38.0 \times 10^{-6}$ or less.

It is preferable to use a soft magnetic metal material as a material of the magnetic powder used herein and use is made of, as the magnetic powder, an Fe-based amorphous alloy powder in which an Fe crystalline phase is precipitated in an Fe amorphous phase by the above-mentioned heat treatment process.

As one example of a method of processing the magnetic powder used in the second basic structure of this invention into a flat shape, there can be cited a method of carrying out grinding in a solvent as in the first basic structure of this invention.

Specifically, it is possible to use a medium stirring type mill such as a ball mill, Attritor (registered trademark), or a pin mill.

Preferably, a heat treatment temperature is lower than a crystallization temperature Tx (° C.) of $Fe_{1-\alpha}TM_\alpha P_w B_x L_y Si_z$ amorphous soft magnetic alloy (wherein α=0 to 0.98, w=3 to 16 at %, x=2 to 16 at %, y=10 at % or less, and z=0 to 8 at %) shown in JP4849542B2 (which will be referred hereinafter to as Patent Document 2). Specifically, in case of the Fe—Si—B—P amorphous alloy, the crystallization temperature Tx is 350 to 450° C. In case of the Fe—Si—B—Nb—Cr amorphous alloy, the crystallization temperature Tx is 300 to 400° C. Thus, the heat treatment temperature is within a range of 300 to 450° C.

As a material of the organic binder used in this invention, it is possible to use a thermoplastic resin such as acrylic rubber, chlorinated polyethylene rubber, polybutadiene rubber, polyisopropylene rubber, ethylene propylene rubber, ethylene propylene diene rubber, styrene-butadiene rubber, nitrile rubber, epichlorohydrine rubber, neoprene rubber, butyl rubber, polysulphide, elastomer rubber such as urethane rubber, polyethylene, polypropylene, polystyrene, acrylic, polyvinyl chloride, polycarbonate, nylon, urethane, polybutylene terephthalate polyethylene terephthalate, or acrylonitrile butadiene-styrene (ABS), a thermosetting resin such as melamine, phenol, epoxy, urethane, polyimide, diallyl phthalate, unsaturated polyester, or furan, or the like.

However, the material of the organic binder is not limited to the above-mentioned materials and the most suitable material can be selected according to the use of a noise suppression sheet to be manufactured, a manufacturing apparatus, and so on.

In order to impart flame resistance to the noise suppression sheet formed of the composite magnetic body or to improve its flame resistance, the organic binder may contain nonmagnetic fine particles such as magnesium hydroxide or melamine cyanurate that exhibit an endothermic action at a temperature of 200° C. or more, or nonmagnetic fine particles such as red phosphorus that form a nonflammable film at a temperature of 200° C. or more.

The magnetic powder according to the second basic structure of this invention is an Fe-based amorphous alloy powder which has been heat-treated to have amorphous and crystalline two phases of Fe and which has a saturation magnetostriction $\lambda s$ of $12.0 \times 10^{-6}$ or more and $38.0 \times 10^{-6}$ or less.

In this invention, the heat treatment method of the magnetic powder is not particularly limited and may be carried out in an inert atmosphere, a reducing atmosphere, or the like according to a known technique. However, if heat treatment is carried out in a nitrogen atmosphere, it is possible to form a high-quality oxide film on the surface of the flat powder and, by this oxide film, it is possible to increase the electrical resistance of the composite magnetic body. As a result, noise can be easily absorbed by the composite magnetic body so that more noise can be lost in the composite magnetic body.

By heat-treating a soft magnetic alloy having an amorphous structure to partially crystallize the composition to thereby precipitate a fine α-Fe crystalline phase, a metal soft magnetic powder having the α-Fe phase and an Fe-based amorphous phase is obtained.

Accordingly, using an Fe—Si—B—Nb—Cr amorphous alloy powder having a saturation magnetostriction $\lambda s$ of $12.1 \times 10^{-6}$, an Fe—P—B—Nb—Cr amophous alloy powder having a saturation magnetostriction $\lambda s$ of $17.0 \times 10^{-6}$, and an Fe—Si—B—P—Cr amorphous alloy powder having a saturation magnetostriction $\lambda s$ of $28.1 \times 10^{-6}$, heat treatment is applied to each of them to precipitate amorphous and crystalline two phases of Fe.

Figure 2:
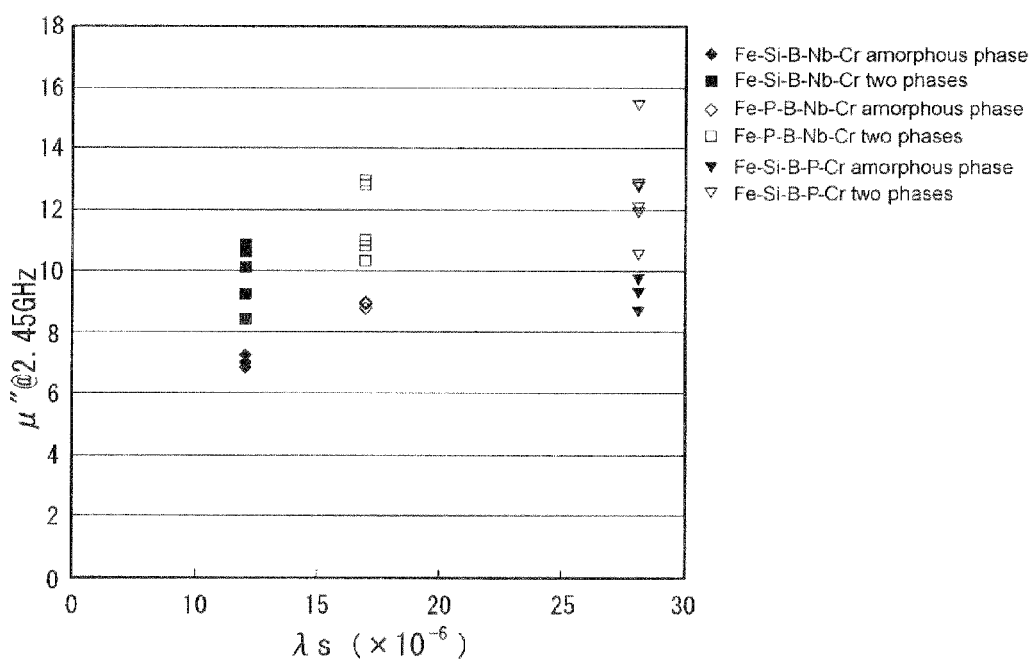
FIG. 2 is a graph showing imaginary part magnetic permeabilities µ" of Fe-based amorphous alloys each having only an amorphous phase or amorphous and crystalline two phases of Fe.

FIG. 2 shows imaginary part magnetic permeabilities $\mu''$ of complex magnetic permeabilities at 2.45 GHz of composite magnetic bodies respectively containing powders of an amorphous single phase in the form of the Fe-based amorphous alloy powders having the above-mentioned composition formulas with no heat treatment applied and powders of amorphous and crystalline two phases of Fe obtained by applying heat treatment to the Fe-based amorphous alloy powders having the above-mentioned composition formulas.

As is clear from FIG. 2, it is seen that, in this invention, the imaginary part magnetic permeability $\mu''$ increases by applying the heat treatment to the Fe-based amorphous alloy powder to precipitate the amorphous and crystalline two phases of Fe.

In order to obtain a higher imaginary part magnetic permeability $\mu''$, the average particle size (D50) of the magnetic powder is preferably 50 μm or more and 127 μm or less.

EXAMPLES

Hereinbelow, Examples of this invention will be described with reference to Tables 1 and 2. All of the magnetic powders shown in Tables 1 and 2 are softmagnetic metal powders.

Examples 1 to 8

As a soft magnetic metal powder of Examples 1 to 8, use was made of an Fe—Si—B—P amorphous alloy powder having a saturation magnetostriction $\lambda s$ of $28.1 \times 10^{-6}$. This Fe-based amorphous alloy powder was produced by an atomizing method and was confirmed to be of an amorphous phase by X-ray diffraction (XRD).

Then, flat powders having average particle sizes (D50) of 26 μm, 50 μm, 86 μm, and 127 μm shown in Examples 1 to 8 of Table 2 were obtained by grinding using a slurry circulation type medium stirring mill. Then, again, the structures of the flat powders were examined by XRD. As a result, it was confirmed that the flat powders each had only an amorphous phase.

These flat Fe-based amorphous alloy powders were heat-treated for 2 hours in a nitrogen atmosphere at temperatures of 350° C. and 450° C. shown in Examples 1 to 8 of Table 2 and then were furnace-cooled. Then, again, the structures of the flat powders were examined by XRD. As a result, it was confirmed that the flat powders each had only amorphous and α-Fe two phases. The temperature at which the phase change occurs, i.e. fine crystals are precipitated, by heat treatment is given as a crystallization start temperature and the crystallization start temperature of Examples 1 to 8 is 528° C.

Then, each of these flat powders and an acrylic rubber binder were mixed at a mixing ratio of 90 wt % and 10 wt %, thereby producing a magnetic coating liquid. Thereafter, the magnetic coating liquid was formed into a sheet shape by a doctor blade method, thereby obtaining a green sheet having a thickness of 20 μm. Six green sheets obtained were stacked together and then were subjected to hot forming at 270° C. and 30 kgf/cm² so that heat not more than the heat treatment temperature for the flat powder was applied to the stacked green sheets, thereby obtaining a noise suppression sheet having a thickness of about 200 μm and a density of 2.4 g/cm³.

Examples 9 to 18

As a soft magnetic metal powder of Examples 9 to 18, use was made of an Fe—P—B—Nb—Cr amorphous alloy powder having a saturation magnetostriction $\lambda s$ of $17.0 \times 10^{-6}$. This Fe-based amorphous alloy powder was produced by an atomizing method and was confirmed to be of an amorphous phase by X-ray diffraction (XRD).

Then, flat powders having average particle sizes (D50) of 28 μm, 68 μm, 110 μm, and 129 μm shown in Examples 9 to 18 of Table 2 were obtained by grinding using a slurry circulation type medium stirring mill. Then, again, the structures of the flat powders were examined by XRD. As a result, it was confirmed that the flat powders each had only an amorphous phase.

These flat Fe-based amorphous alloy powders were heat-treated for 2 hours in a nitrogen atmosphere at temperatures of 350° C. and 450° C. shown in Examples 9 to 18 of Table 2 and then were furnace-cooled, Then, again, the structures of the flat powders were examined by XRD. As a result, it was confirmed that the flat powders each had only amorphous and α-Fe two phases. The crystallization start temperature of Examples 9 to 18 is 497° C.

Then, each of these flat powders and an acrylic rubber binder were mixed at a mixing ratio of 90 wt % and 10 wt %, thereby producing a magnetic coating liquid. Thereafter, the magnetic coating liquid was formed into a sheet shape by a doctor blade method, thereby obtaining a green sheet having a thickness of 20 μm, Six green sheets obtained were stacked together and then were subjected to hot forming at 270° C. and 30 kgf/cm² so that heat not more than the heat treatment temperature for the flat powder was applied to the stacked green sheets, thereby obtaining a noise suppression sheet having a thickness of about 200 μm and a density of 2.4 g/cm³.

Comparative Examples 1 to 3

As a soft magnetic metal powder of Comparative Examples 1 to 3, use was made of an Fe—Si—B—P amorphous alloy powder having a saturation magnetostriction λs of 28.1×10⁻⁶. This Fe-based amorphous alloy powder was produced by an atomizing method and was confirmed to be of an amorphous phase by X-ray diffraction (XRD).

Then, flat powders having average particle sizes (D50) of 50 μm, 86 μm, and 127 μm shown in Comparative Examples 1 to 3 of Table 2 were obtained by grinding using a slurry circulation type medium stirring mill. Then, again, the structures of the flat powders were examined by XRD. As a result, it was confirmed that the flat powders each had only an amorphous phase.

These flat Fe-based amorphous alloy powders were heat-treated for 2 hours in a nitrogen atmosphere at a temperature of 500° C. and then were furnace-cooled. Then, again, the structures of the flat powders were examined by XRD. As a result, it was confirmed that the flat powders each included a compound crystalline phase other than an α-Fe phase. The crystallization start temperature of Comparative Examples 1 to 3 is 528° C.

Then, each of these flat powders and an acrylic rubber binder were mixed at a mixing ratio of 90 wt % and 10 wt %, thereby producing a magnetic coating liquid. Thereafter, the magnetic coating liquid was formed into a sheet shape by a doctor blade method, thereby obtaining a green sheet having a thickness of 20 μm. Six green sheets obtained were stacked together and then were subjected to hot forming at 270° C. and 30 kgf/cm² so that heat not more than the heat treatment temperature for the flat powder was applied to the stacked green sheets, thereby obtaining a noise suppression sheet having a thickness of about 200 μm and a density of 2.4 g/cm³.

Comparative Examples 4 to 7

As a magnetic powder of Comparative Examples 4 to 7, use was made of an Fe—P—B—Nb—Cr amorphous alloy powder having a saturation magnetostriction λs of 17.0×10⁻⁶. This Fe-based amorphous alloy powder was produced by an atomizing method and was confirmed to be of an amorphous phase by X-ray diffraction (XRD).

Then, flat powders having average particle sizes (D50) of 28 μm, 59 μm, 68 μm, and 110 μm shown in Comparative Examples 4 to 7 of Table 2 were obtained by grinding using a slurry circulation type medium stirring mill. Then, again, the structures of the flat powders were examined by XRD. As a result, it was confirmed that the flat powders each had only an amorphous phase.

These flat Fe-based amorphous alloy powders were heat-treated for 2 hours in a nitrogen atmosphere at a temperature of 500° C. and then were furnace-cooled. Then, again, the structures of the flat powders were examined by XRD. As a result, it was confirmed that the flat powders each included a compound crystalline phase other than an α-Fe phase. The crystallization start temperature of Comparative Examples 4 to 7 is 497° C.

Then, each of these flat powders and an acrylic rubber binder were mixed at a mixing ratio of 90 wt % and 10 wt %, thereby producing a magnetic coating liquid. Thereafter, the magnetic coating liquid was formed into a sheet shape by a doctor blade method, thereby obtaining a green sheet having a thickness of 20 μm. Six green sheets obtained were stacked together and then were subjected to hot forming at 270° C. and 30 kgf/cm² so that heat not more than the heat treatment temperature for the flat powder was applied to the stacked green sheets, thereby obtaining a noise suppression sheet having a thickness of about 200 μm and a density of 2.4 g/cm³.

Imaginary part magnetic permeabilities μ" of complex magnetic permeabilities at 2.45 GHz of the noise suppression sheets obtained in Examples 1 to 18 and Comparative Examples 1 to 7 were measured using Impedance/Material Analyzer E4991A manufactured by Agilent Technologies, Inc and the measured values are shown in Table 2.

TABLE 2

| | Composition Formula | Average Particle Size (μm) | λs (×10⁻⁶) | Crystallization Start Temperature (° C.) | Heat Treatment Temperature (° C.) | μ" |
|---|---|---|---|---|---|---|
| Example 1 | Fe—Si—B—P—Cr amorphous alloy | 26 | 28.1 | 528 | 350 | 8.8 |
| Example 2 | Fe—Si—B—P—Cr amorphous alloy | 50 | 28.1 | 528 | 350 | 12.0 |
| Example 3 | Fe—Si—B—P—Cr amorphous alloy | 86 | 28.1 | 528 | 350 | 15.4 |
| Example 4 | Fe—Si—B—P—Cr amorphous alloy | 127 | 28.1 | 528 | 350 | 10.5 |

TABLE 2-continued

| | Composition Formula | Average Particle Size (μm) | λs (×10⁻⁶) | Crystallization Start Temperature (° C.) | Heat Treatment Temperature (° C.) | $\mu''$ |
|---|---|---|---|---|---|---|
| Example 5 | Fe—Si—B—P—Cr amorphous alloy | 26 | 28.1 | 528 | 450 | 10.6 |
| Example 6 | Fe—Si—B—P—Cr amorphous alloy | 50 | 28.1 | 528 | 450 | 12.8 |
| Example 7 | Fe—Si—B—P—Cr amorphous alloy | 86 | 28.1 | 528 | 450 | 11.9 |
| Example 8 | Fe—Si—B—P—Cr amorphous alloy | 127 | 28.1 | 528 | 450 | 12.7 |
| Example 9 | Fe—P—B—Nb—Cr Amorphous Alloy | 28 | 17.0 | 497 | 350 | 10.5 |
| Example 10 | Fe—P—B—Nb—Cr Amorphous Alloy | 59 | 17.0 | 497 | 350 | 10.8 |
| Example 11 | Fe—P—B—Nb—Cr Amorphous Alloy | 68 | 17.0 | 497 | 350 | 11.0 |
| Example 12 | Fe—P—B—Nb—Cr Amorphous Alloy | 110 | 17.0 | 497 | 350 | 12.9 |
| Example 13 | Fe—P—B—Nb—Cr Amorphous Alloy | 129 | 17.0 | 497 | 350 | 11.6 |
| Example 14 | Fe—P—B—Nb—Cr Amorphous Alloy | 28 | 17.0 | 497 | 450 | 10.1 |
| Example 15 | Fe—P—B—Nb—Cr Amorphous Alloy | 59 | 17.0 | 497 | 450 | 12.8 |
| Example 16 | Fe—P—B—Nb—Cr Amorphous Alloy | 68 | 17.0 | 497 | 450 | 10.3 |
| Example 17 | Fe—P—B—Nb—Cr Amorphous Alloy | 110 | 17.0 | 497 | 450 | 10.9 |
| Example 18 | Fe—P—B—Nb—Cr Amorphous Alloy | 129 | 17.0 | 497 | 450 | 8.3 |
| Comparative Example 1 | Fe—Si—B—P—Cr amorphous alloy | 50 | 28.1 | 528 | 500 | 7.2 |
| Comparative Example 2 | Fe—Si—B—P—Cr amorphous alloy | 86 | 28.1 | 528 | 500 | 7.3 |
| Comparative Example 3 | Fe—Si—B—P—Cr amorphous alloy | 127 | 28.1 | 528 | 500 | 7.6 |
| Comparative Example 4 | Fe—P—B—Nb—Cr Amorphous Alloy | 28 | 17.0 | 497 | 500 | 2.9 |
| Comparative Example 5 | Fe—P—B—Nb—Cr Amorphous Alloy | 59 | 17.0 | 497 | 500 | 3.1 |
| Comparative Example 6 | Fe—P—B—Nb—Cr Amorphous Alloy | 68 | 17.0 | 497 | 500 | 3.1 |
| Comparative Example 7 | Fe—P—B—Nb—Cr Amorphous Alloy | 110 | 17.0 | 497 | 500 | 3.1 |

Figure 3:
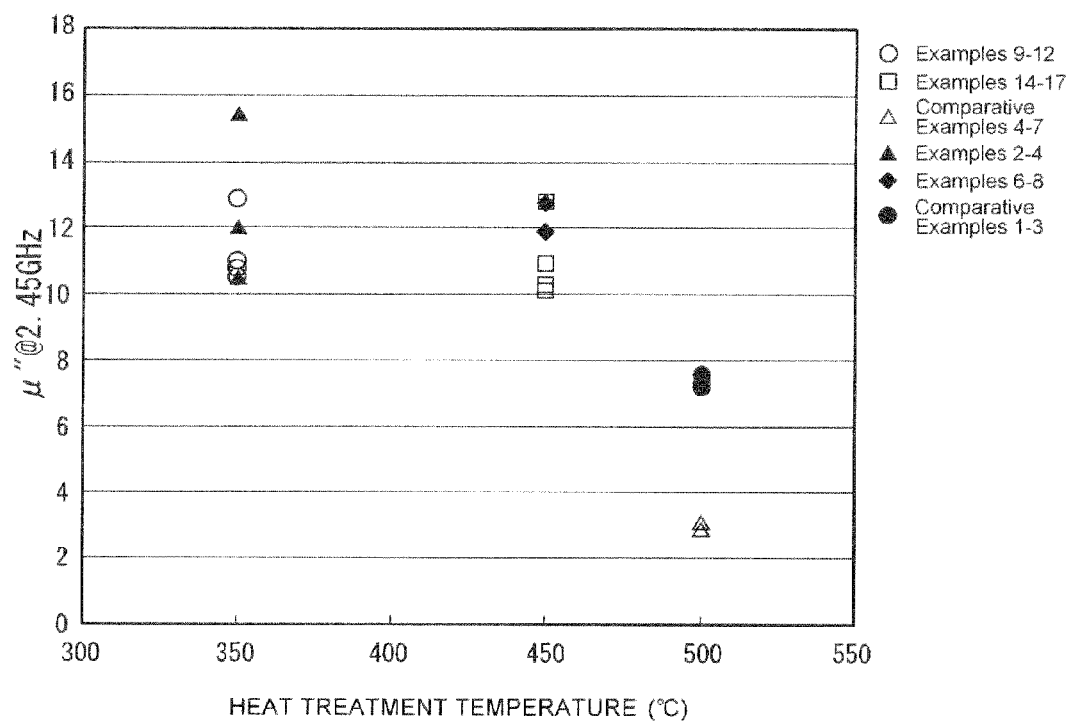
FIG. 3 is a graph showing the relationships between a heat treatment temperature and the imaginary part magnetic permeability µ".

FIG. 3 is a graph showing the relationships between the heat treatment temperature and the imaginary part magnetic permeability $\mu''$. In FIG. 3, there are shown the relationships between the heat treatment temperature and the imaginary part magnetic permeability $\mu''$ at 2.45 GHz in Examples 2 to 4, 6 to 12, and 14 to 17 and Comparative Examples 1 to 7 of Table 2.

As is clear from FIG. 3, in Comparative Examples 1 to 7 where the compound crystals other than the α-Fe phase were precipitated by the heat treatment, the imaginary part magnetic permeabilities $\mu''$ were significantly lower than those in Examples 2 to 4, 6 to 12, and 14 to 17 where only the amorphous and α-Fe two phases were present. Accordingly, it is preferable to carry out heat treatment at a temperature at which no compound crystals other than the α-Fe phase are precipitated.

Figure 4:
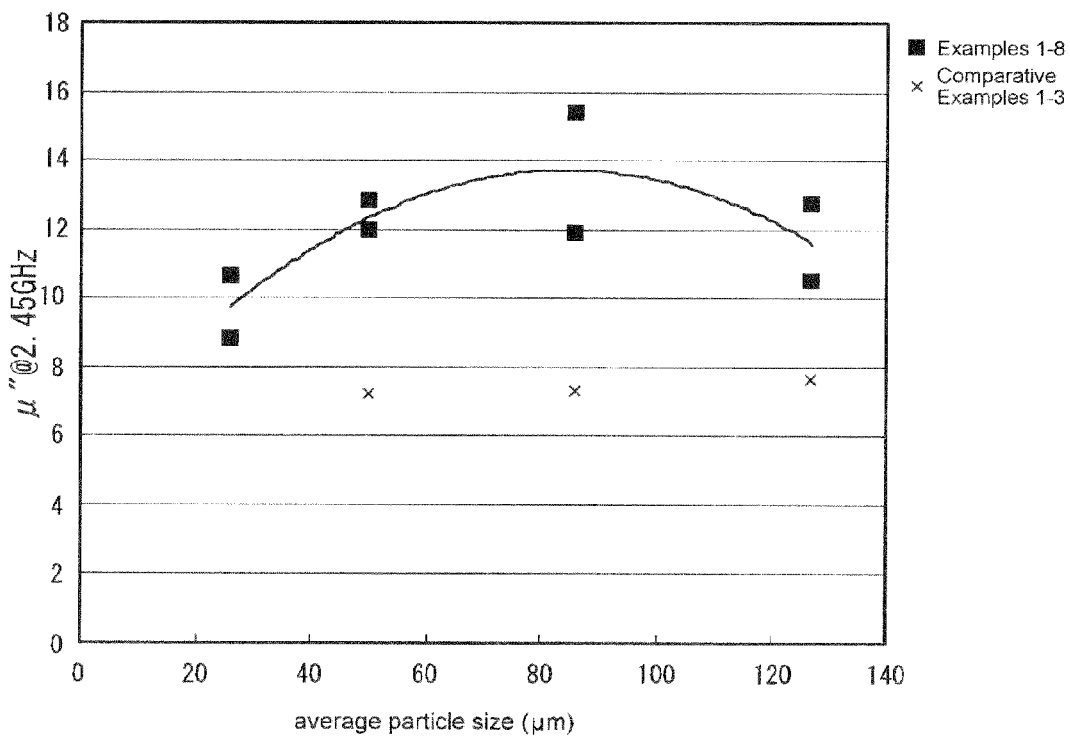
FIG. 4 is a graph showing a relationships between an average particle size (D50) and the imaginary part magnetic permeability µ".

FIG. 4 is a graph showing the relationships between the average particle size (D50) and the imaginary part magnetic permeability $\mu''$. In FIG. 4, there are shown the relationships between the average particle size (D50) and the imaginary part magnetic permeability $\mu''$ at 2.45 GHz in Examples 1 to 8 and Comparative Examples 1 to 3 of Table 2.

As is clear from FIG. 4, the imaginary part magnetic permeability $\mu''$ decreases across an average particle size (D50) of 86 μm. Accordingly, the average particle size (D50) of the soft magnetic metal powder is preferably 50 μm or more and 127 μm or less.

In this manner, there is obtained a noise suppression sheet whose imaginary part magnetic permeability $\mu''$, representing a magnetic loss component, is large at a GHz-band frequency, thus having an excellent noise suppression effect.

While the Examples of this invention have been described above, this invention is not limited thereto and changes and modifications can be made to the structures within the scope not departing from the gist of this invention.

For example, composition formulas of Fe-based amorphous alloys are not limited to those described above. The most suitable material can be selected according to the use of a noise suppressor to be manufactured, a manufacturing apparatus, and so on. That is, it goes without saying that various changes and modifications that can be made by those skilled in the art are also included in this invention.

What is claimed is:
1. A noise suppression sheet formed of a composite magnetic body comprising a flat magnetic powder having a saturation magnetostriction of $12.0 \times 10^{-6}$ or more and $38.0 \times 10^{-6}$ or less and an organic binder, the flat magnetic powder being obtained by heat-treating a flat Fe-based amorphous alloy powder having an amorphous phase, the flat magnetic powder having the amorphous phase at least at one part of the flat magnetic powder, and not having a compound crystalline phase precipitated in the flat magnetic powder, excluding an α-Fe crystalline phase;

wherein the flat Fe-based amorphous alloy powder contains a soft magnetic metal material;

wherein the flat magnetic powder has two phases consisting of the amorphous phase and a crystalline phase consisting of the α-Fe crystalline phase; and wherein the flat Fe-based amorphous alloy powder is a powder of a Fe—Si—B—P—Cr amorphous alloy, and said alloy containing 76 to 80 at % of Fe.

2. The noise suppression sheet according to claim 1, wherein the flat magnetic powder has a saturation magnetostriction of $12.1 \times 10^{-6}$ or more and $30.6 \times 10^{-6}$ or less.

3. The noise suppression sheet according to claim 1, wherein the flat magnetic powder has an average particle size (D50) of 50 μm or more and 127 μm or less.

4. The noise suppression sheet according to claim 1, wherein the noise suppression sheet has an imaginary part magnetic permeability μ" of 8.3 or more and 15.4 or less at 2.45 GHz.

5. A method of manufacturing a noise suppression sheet comprising forming, into a sheet shape, a composite magnetic body in which an organic binder is mixed into a flat magnetic powder having a saturation magnetostriction of $12.0 \times 10^{-6}$ or more and $38.0 \times 10^{-6}$ or less, the flat magnetic powder being obtained by heat-treating a flat Fe-based amorphous alloy powder having an amorphous phase, the flat magnetic powder having the amorphous phase at least at one part of the flat magnetic powder, and not having a compound crystalline phase precipitated in the flat magnetic powder, excluding an α-Fe crystalline phase;

wherein the flat Fe-based amorphous alloy powder contains a soft magnetic metal material;

wherein the flat magnetic powder has two phases consisting of the amorphous phase and a crystalline phase consisting of the α-Fe crystalline phase; and wherein the flat Fe-based amorphous alloy powder is a powder of a Fe—Si—B—P—Cr amorphous alloy, and said alloy containing 76 to 80 at % of Fe.

6. The method of manufacturing a noise suppression sheet according to claim 5, wherein the flat magnetic powder has a saturation magnetostriction of $12.1 \times 10^{-6}$ or more and $30.6 \times 10^{-6}$ or less.

7. The method of manufacturing a noise suppression sheet according to claim 5, wherein the flat magnetic powder has an average particle size (D50) of 50 μm or more and 127 μm or less.

8. The method of manufacturing a noise suppression sheet according to claim 5, wherein the noise suppression sheet has an imaginary part magnetic permeability μ" of 8.3 or more and 15.4 or less at 2.45 GHz.

9. A flat magnetic powder having a saturation magnetostriction of $12.0 \times 10^{-6}$ or more and $38.0 \times 10^{-6}$ or less and having a flat shape, the flat magnetic powder being obtained by heat-treating a flat Fe-based amorphous alloy powder having an amorphous phase, the flat magnetic powder having the amorphous phase at least at one part of the flat magnetic powder, and not having a compound crystalline phase precipitated in the flat magnetic powder, excluding an α-Fe crystalline phase;

wherein the flat Fe-based amorphous alloy powder contains a soft magnetic metal material;

wherein the flat magnetic powder has two phases consisting of an amorphous phase and a crystalline phase consisting of the α-Fe crystalline phase; and wherein the flat Fe-based amorphous alloy powder is a powder of a Fe—Si—B—P—Cr amorphous alloy, and said alloy containing 76 top 80 at % of Fe.

10. The flat magnetic powder according to claim 9, wherein the flat magnetic powder has a saturation magnetostriction of $12.1 \times 10^{-6}$ or more and $30.6 \times 10^{-6}$ or less.

11. The flat magnetic powder according to claim 9, wherein the flat magnetic powder has an average particle size (D50) of 50 μm or more and 127 μm or less.

12. A method of manufacturing the flat magnetic powder claimed in claim 9, the method comprising:

(a) forming a Fe-based amorphous alloy powder from the soft magnetic metal material by an atomizing method, (b) grinding the Fe-based amorphous alloy powder from step (a) to form it into the flat Fe-based amorphous alloy powder, (c) heat-treating the flat Fe-based amorphous alloy powder from step (b) to obtain the flat magnetic powder, which is a flat shape soft magnetic metal powder having a saturation magnetostriction of $12.0 \times 10^{-6}$ or more and $38.0 \times 10^{-6}$ or less;

wherein the flat magnetic powder has two phases consisting of an amorphous phase and a crystalline phase consisting of the α-Fe crystalline phase; and wherein the flat Fe-based amorphous alloy powder is a powder of a Fe—Si—B—P—Cr amorphous alloy, said alloy containing 76 to 80 at % of Fe.

13. The method of manufacturing a flat magnetic powder according to claim 12, wherein the heat-treating step (c) is carried out by heating the flat Fe-based amorphous alloy powder at a temperature lower than a crystallization temperature to precipitate said crystalline phase consisting of the α-Fe crystalline phase, in an Fe amorphous phase.

14. The method of manufacturing a flat magnetic powder according to claim 12, wherein the flat magnetic powder has an average particle size (D50) of 50 μm or more and 127 μm or less.

* * * * *